Aug. 5, 1969 E. J. SPERBER 3,459,055

PRESET UHF TUNING MECHANISM

Filed Jan. 21, 1966 2 Sheets-Sheet 1

INVENTOR.
EDWARD J. SPERBER
BY
Eugene M. Whitacre
Attorney

Aug. 5, 1969 E. J. SPERBER 3,459,055

PRESET UHF TUNING MECHANISM

Filed Jan. 21, 1966 2 Sheets-Sheet 2

INVENTOR.
EDWARD J. SPERBER
BY
Eugene M. Whitacre
Attorney

United States Patent Office 3,459,055
Patented Aug. 5, 1969

3,459,055
PRESET UHF TUNING MECHANISM

Edward J. Sperber, Indianapolis, Ind., assignor to RCA Corporation, a corporation of Delaware Filed Jan. 21, 1966, Ser. No. 522,297
Int. Cl. F16h 35/18
U.S. Cl. 74—10.6 8 Claims

ABSTRACT OF THE DISCLOSURE

A tuning mechanism for a UHF tuner includes a cam member which carries a plurality of adjustable control elements which may be preset to a particular channel tuning position. The cam member may be rotated to bring the the tips of the control elements against a tuner actuating member which controls the movement of the tuner shaft.

The present invention relates to tuning mechanisms and more particularly to step-by-step preset tuning mechanisms for ultrahigh frequency television tuners.

Present authorization for the transmission of television signals includes 12 channels in the very high frequency (VHF) band and 70 channels in the ultrahigh frequency (UHF) band. Many receivers manufactured for home use include step-by-step tuning of the VHF television channels, and continuous tuning of the UHF channels. With increased numbers of UHF stations, it is desirable, from the consumers' point of view to provide the same general type of tuning operation for UHF channels as for the VHF channels and thereby facilitate UHF channel selection.

In order to receive UHF color signals with a step-by-step tuner, resettability becomes a greater problem. For acceptable color reception, a step-by-step tuner should be resettable to within about $\pm 100$ kilocycles (kc./s.) of a given frequency. Any further deviation in resettability will result in degradation of the color picture presentation requiring an additional manual adjustment to retune to the desired station.

It is an object of this invention to provide an improved step-by-step ultrahigh frequency preset television tuner mechanism.

It is a further object of this invention to provide an improved step-by-step ultrahigh frequency television tuner mechanism which can be preset at any of the step positions to select one of a plurality of ultrahigh frequency television channels and which when switched away from and then back to a preset step position accurately resets the tuner to the desired television channel.

It may be assumed that the useable UHF signals in any given location will be separated by a predetermined number of channels. For example, it may be presumed that in any given area serviced by more than one UHF station, the channel allocations will be separated by at least three channels. In such a case, the UHF tuning mechanism may, for example, be provided with twenty-four spaced detent positions, each of which is capable of receiving three different UHF channels except for one or two of the positions which would receive fewer UHF channels. A preset tuning mechanism may then be provided to select a given one of the channels in any one of the detent positions.

In accordance with the invention, a rotatable cam member is provided with a plurality of adjustable control elements equally spaced along the cam surface. The cam member is suitably detented, and as it is rotated through its plurality of detent positions, the control elements make successive contact with a tuner actuating member. The rotation of the cam member controls the movement of the tuner actuating member which movement is translated to the tuning element of a continuously tunable UHF television tuner.

The adjustable control elements are preset to select a desired one of the plurality of channels available at the various detent settings of the rotary tuner. The setting of the adjustable control elements controls the position of the tuner actuating member to adjust the tuning of the UHF tuner. The tuner is thereby preset to tune to the same station each time the mechanism is rotated to that particular detent position.

A feature of the invention comprises employing the cam which provides support for the control elements near their tips so as to minimize the amount of play possible in their adjustment. The cam also provides a surface for guiding the tuner actuating member between control elements when one or more consecutive control elements are backed out of their normal tuning positions, such as for tuner motor programming. When this situation does occur, the spiral surface of the cam allows the tuner actuating member to continue to operate smoothly as the cam rotates from one stop position to another.

The invention will further be understood from the following description considered in connection with the accompanying drawings.

Figures 1, 2:
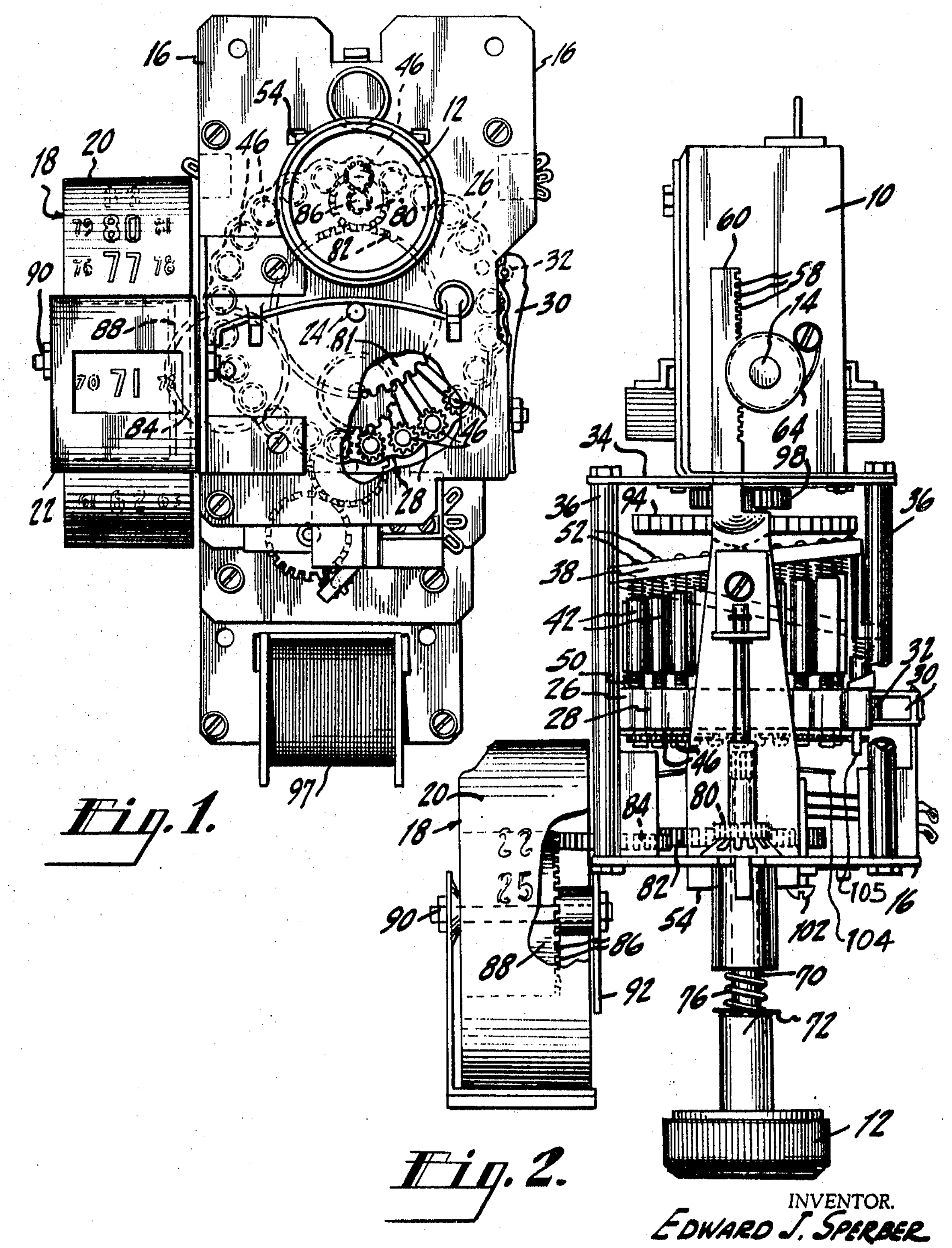
FIGURE 1 is a front view, partially broken away, of a preset tuning and channel indication mechanism for a UHF television tuner embodying the invention.
FIGURE 2 is a top view of the preset tuning and channel indication mechanism shown in FIGURE 1.

Referring to the drawings, wherein like elements and parts are designated by like reference characters throughout the various figures, and referring particularly to FIGURE 2, it will be seen that the tuning mechanism includes an ultrahigh frequency tuner 10 suitably mounted for operation by a control knob 12. The tuner 10 may be of the type which covers the entire UHF television band for 180° of the rotation of a tuner shaft 14.

FIGURE 1 illutrates a front view of the tuning mechanism of the present invention. In order to mount the mechanism in a television receiver, there is provided a front mounting plate 16. Associated with the mechanism is a channel indicator assembly 18 which includes a rotatable translucent drum 20 having the channel numbers carried thereon and a viewing window frame 22 which is secured so as to expose the channel numbers to which the tuner 10 can be tuned. The channel numbers are arranged about the peripheral surface of the drum 20 in groups of three so that in each separate detent position three channel numbers will appear. As shown in FIGURE 1, channel numbers 70, 71 and 72 appear in the opening to indicate that the mechanism is, or can be, preset to one of these three channels. The manner in which one of the three channels is selected will be described later.

Mounted for rotation with a shaft 24 is a rotary turret 26 having a plurality of detent notches 28 spaced around the periphery thereof. The turret 26 has twenty-five detent notches 28 around the periphery thereof so that for one complete revolution of the turret 26 there will be twenty-five stop positions. As will be explained, only 24 of the detent positions are used. Since there are 70 channels in the UHF band, there will be three channels covered by each of the twenty-four stop positions except for the two limit positions, each of which will cover only two channels. A detent spring 30 which carries a rotatable detent wheel 32 is connected to the front mounting plate 16. The detent wheel 32 rests in the detent notches 28 so that firm contact is made between the wheel 32 and the notches 28 of the turret 26 as it is rotated in order to firmly hold the turret in each stop position.

Referring to FIGURE 2 it can be seen that the turret 26 is mounted for rotation between the front mounting plate 16 and a rear mounting plate 34. The two mounting plates 16 and 34 are connected by support members 36.

Figures 3, 4:
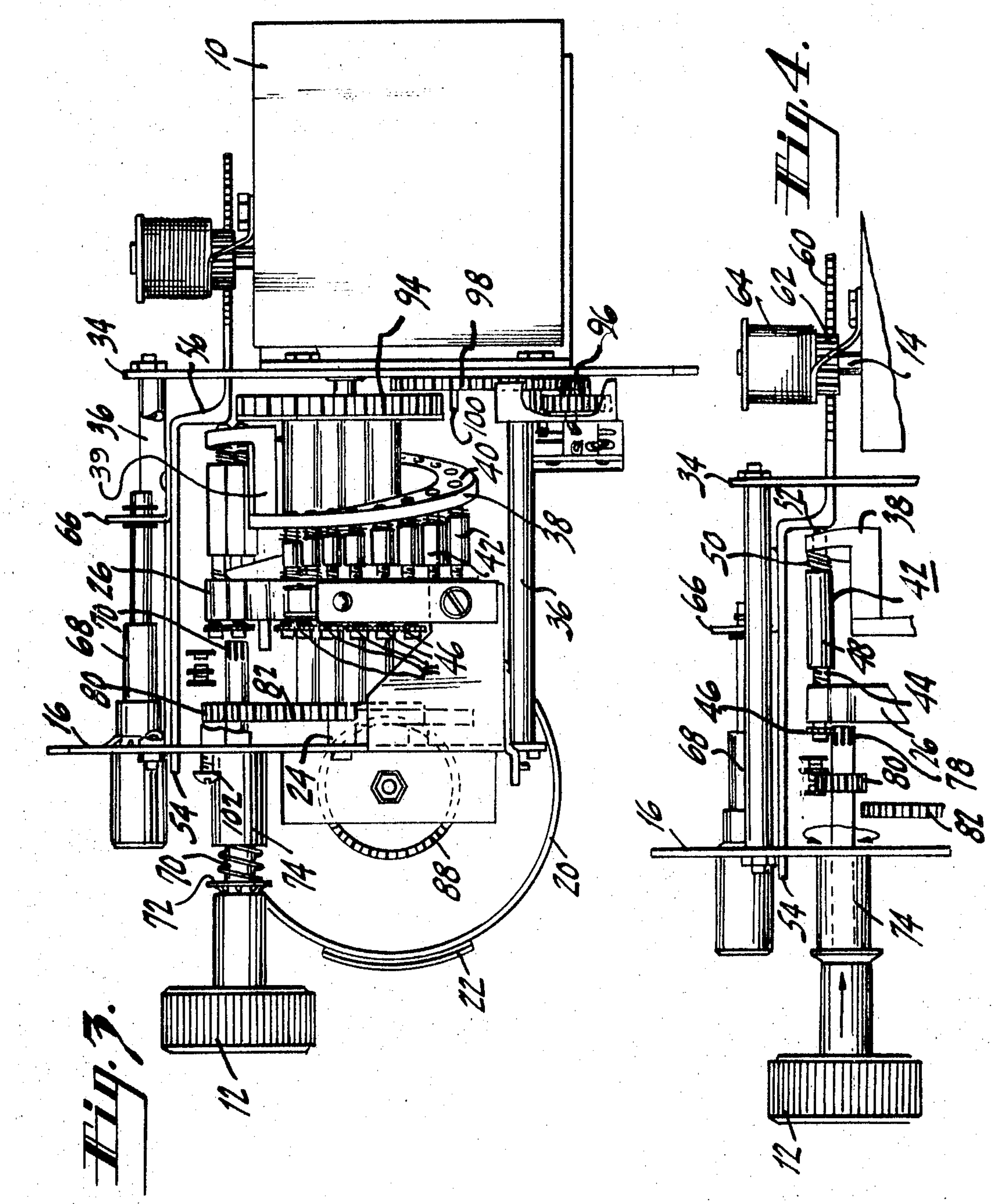
FIGURE 3 is a side view of the preset tuning and channel indication mechanism shown in FIGURE 1.
FIGURE 4 is a side view of a portion of the tuning mechanism of FIGURE 1 showing the control knob depressed for adjustment of one of the control elements.

As shown in FIGURE 3, a cam member 38 which is an integral part of the turret 26 has an axially projecting spiral cam surface 40. Adjustable control elements 42 are carried by the turret 26 and the cam member 38 in a circular row near the periphery thereof and extending in parallel relation to each other. Each of the adjustable control elements 42 includes a threaded portion 44 near one end (see FIGURE 4), which is received in a correspondingly tapped portion of the turret 26. Pinions 46 are mounted on the ends of the elements which projects from the turret 26. The portions 48 of each of the control elements 42 located between the turret 26 and the cam member 38 are of greater diameter than the rest of the element. A smaller diameter portion of the control elements 42 which passes through the cam member 38 has a small tip 52 which extends slightly from the spiral cam surface 40 of the cam member 38. The control elements 42 vary in length depending upon the distance of the spiral surface 40 from the turret 26 so that no two rods are of the same length. A spring 50 surrounds the smaller diameter portion of each of the control elements between the cam member 38 and larger diameter portion 48 to hold the control elements firmly in position. The larger diameter portions 48 also serve as a stop to retain the control elements in the turret assembly.

Mounted above the turret 26 and the cam member 38 is a tuner actuating member or slide 54 which extends through the front mounting plate 16 and through the rear mounting plate 34. The slide 54 has an elbow 56 which engages the tips 52 of the adjustable control elements 42 extending from the cam surface 40. The slide 54 has a set of gear teeth 58 (see FIGURE 2) on one end 60 thereof. The gear teeth 58 on the end 60 of the slide 54 engage a gear 62 (FIGURE 3) which is mounted on the tuner control shaft 14. Mounted above the gear 62 on the tuner shaft 14 is a backlash reducing spring member 64 fixed at one end to the tuner 10 which biases the tuner control shaft 14 so as to firmly hold it in each separate stop position of the turret 26. Secured to the slide 54 between the front and rear mounting plates 16 and 34 respectively is a bracket 66. Carried by the front mounting plate 16 and the bracket 66 and positioned above the slide 54 is a damping device such as a pneumatic dash pot 68 which assists in biasing the elbow 56 of the slide 54 against the tips 52 of the adjustable control elements 42 and further serves to damp the return movement of the slide 54 during the transition from the highest numbered to the lowest numbered channel positions.

As best seen in FIGURE 3, the cam 38 has a discontinuity 39 separating the detent positions corresponding to the highest and lowest UHF television channels. At the discontinuity there is a detent position which is not used accounting for the 25 detent positions mentioned above. It will be noted that the turret and cam assembly are continuously rotatable in a counterclockwise direction (clockwise rotation of knob 12) since the elbow 56 of the slide 54 will slide back to its forwardmost position at the discontinuity under the pressure of the spring member 64.

Passing through the front mounting plate 16 below the slide 54 is a shaft 70 which may be manually rotated by the knob 12. The shaft 70 is axially movable toward the front mounting plate 16 against the force of a spring 76 which bears against a C washer 72 on the shaft 70 and a bushing 74 which extends from the mounting plate 16. On the end of the shaft 70 opposite the knob 12 is a gear 78 which engages one of the pinions 46 of the adjustable control elements 42 when the knob 12 is depressed. Secured on the shaft 70 for rotation therewith between the front mounting plate 16 and the gear 78 is a gear 80 which engages a second gear 82 when the shaft is in the position shown in FIGURES 2 and 3. The gear 82 drives a third gear 84 which meshes with a ring gear 86. The ring gear 86 may comprise an integral portion of the channel number drum 20. Both the channel number drum 20 and the ring gear 86 are mounted for rotation about a shaft 90 which is secured to an extension 92 of the front mounting plate 16. As the knob 12 is turned, the gears 80, 82 and 84 will rotate and cause the ring gear 88 and the channel number drum 20 to rotate.

Mounted on the end of the shaft 24 between the cam surface 40 and the rear mounting plate 34 is a star wheel 94 which forms part of a Geneva gear system. Secured to the tuner 10 is a gear train generally indicated by the numeral 96 which is driven by a motor 97 which may be controlled from a remote location. As part of the gear train 96 there is a gear 98 which has a stud 100 secured thereto. The star wheel 94, and the stud 100 on the gear 98 form a Geneva gear system which when operated by the motor 97 cause the turret 26 and cam member 38 to rotate one detent position for every rotation of the gear 98.

Although the biasing mechanism for the slide 54 as shown in the drawings is a coiled spring 64, any other suitable means of biasing the elbow 56 of the slide 54 against the spiral surface 40 and the tips 52 may be employed. For example, a simple helical spring connected from the end 60 of the slide 54 to the front mounting plate to provide tension on the slide 54 has been found to be satisfactory in practicing the invention.

In order to adjust the control elements 42 the knob 12 must be pressed so as to cause the gear 80 to disengage the indicator drive gear 82 and cause the gear 78 on the end of the shaft 70 to engage a pinion 46 on the end of one of the control elements 42. When this is done, as shown in FIGURE 4, rotation of the knob 12 will cause the control element 42 to either move towards or away from the front mounting plate 16 depending on the direction of rotation of the knob. If the knob is so turned that the element 42 moves away from the front mounting plate 16 the tip 52 will extend further from the spiral surface 40 of the cam member 38 thereby causing the slide 54 to move, which in turn, rotates the gear 62 on the end of the tuner control shaft 14. The adjustment of the control elements 42 is provided in order to permit a presetting of a desired one of the two or three channels covered by that particular detent stop position. After the desired channel has been preset as described, subsequent rotation of the knob 12 back to that channel position causes the tuner to be reset to that channel with great accuracy.

It should be well understood that the cam member 38 and its function provide an essential feature of the present invention. The cam member 38 provides one very important function in that the surface 40 supports the elements 42 very near their tips 52. By supporting the elements 42 near their tips 52 the amount of play in the adjustment of the control elements 42 will be minimized. In a mechanism of the type described only a half mil movement of the slide 54 from its original preset position can change the UHF tuner setting sufficiently to cause an unacceptable color picture presentation. Therefore, the cam member 38 of the present invention is arranged to provide the necessary support to reduce the play in the control elements 42 to the extent that fine tuning and resettability of the tuning mechanism are not destroyed when the cam member 38 is rotated to the channel at any given detent stop position.

In addition, the cam member 38 provides the very important function of retaining the slide 54 in proper position so that it may not be stopped by or break off any of the successive control elements 42 when one or more consecutive control elements are completely withdrawn so that their tips 52 do not protrude from the spiral cam surface 40 of the cam member 38. Were it not for the cooperation of the cam surface 40 with the slide 54, when one or more adjacent elements were so backed off, the slide would slip back against the tips of those backed off elements. In such a position the slide would be stopped by the next successive control element which projects out significantly further thus preventing the cam member 38 from being rotated any further. If further rotation were attempted, it would result in the breaking off of the ends of the successive control elements. From the above, the importance of the cam member 38 can be appreciated.

The adjustable control elements 42 can provide a motor programming system to prevent the tuner from stopping at undesired (such as unused) detent positions when the tuner is motor controlled. To do this the control elements 42 for unused detent positions are rotated to a limit position toward the front mounting plate 16. As the motor drives the turret through such a detent position, the element 42 projects out far enough to engage a spring leaf contact element 104, and deflect it into engagement with a screw 102. The screw 102 and spring 104 form a switch which is connected to keep the motor 97 energized in that detent position as is known. Thus, the motor continues to drive the turret to the next detent position. A stud 105 at the unused detent position at the cam discontinuity engages the spring 104 to close the switch and prevent the motor from stopping the tuner in this position.

The operation of the preset tuning mechanism of the present invention is as follows. Initially, all the channels which are receivable in a given locality may be preset by adjusting the control elements 42 as described in the manner set forth above. By presetting all these receivable channels, then, any subsequent time that the mechanism is adjusted to that channel position the receiver will be properly adjusted and will need no further tuning. Once the control elements have been properly preset by the fine tuning of the receivable channels, then as the knob 12 is turned in its undepressed position, the turret 26 and the spiral cam member 38 will be rotated by the gears as described above. As the cam member 38 rotates, the control elements extending from the cam surface 40 successively engage the slide 54 and cause it to move. The slide 54 in its movement will cause the tuner control shaft 14 to be rotated to adjust the tuner 10 over its frequency range. Simultaneous with the rotation of the cam member 38, the channel drum 20 will be rotated to bring the proper channel being tuned into the opening defined by the viewing window frame 22.

What is claimed is:

1. A tuning mechanism comprising in combination:
a tuner including an adjustable control shaft to tune said tuner over a range of frequencies;
an adjustable member having a cam surface,
means providing a plurality of adjustable control elements extending from said cam surface, detent means for providing at least one stop position for each of said control elements,
a tuner actuating member positioned for engagement by successive ones of said adjustable control elements as said adjustable member is moved from one stop position to the next;
means coupling said tuner actuating member to said tuner control shaft; and
means for adjusting of said adjustable control elements.

2. A preset tuning mechanism for ultrahigh frequency television tuners comprising in combination:
an ultrahigh frequency tuner including an adjustable tuning control shaft with a gear attached thereto, said tuner being continuously tunable over the ultrahigh frequency range;
an adjustable member having a cam surface and a plurality of adjustable tuning control elements;
detent means for providing at least one stop position for each of said control elements;
a tuner actuating means, means for biasing said tuner actuating means to a position for engagement by successive ones of said plurality of said adjustable tuning control elements, said tuner actuating means being coupled to said tuner control shaft to rotate said tuner control shaft through said tuner control shaft gear, whereby the motion of said tuner actuating means tunes said tuner to the desired one of said channels in each of said detent stop positions depending upon the adjustment of said adjustable control elements; and
means for effecting adjustment of adjustable control elements.

3. A preset tuning mechanism as set forth in claim 2 wherein:
said adjustable tuning control elements are secured around the periphery of said member and said detent means and lie generally parallel to the axis of rotation of said member.

4. A preset tuning mechanism as set forth in claim 2 wherein:
said tuner actuating means includes a slide which is biased against an adjustable control element by a damping member including a telescoping shaft, the telescoping end of which is secured to said slide, and by a spring carried by said tuner control shaft.

5. A preset tuning mechanism as set forth in claim 2 wherein:
said tuner actuating means includes a slide which is biased against an adjustable control element by spring means, said spring means comprising a coiled spring fixed at one end thereof and coupled to said slide means.

6. A preset tuning mechanism as set forth in claim 2 wherein:
the number of adjustable control elements is less than half the total number of ultrahigh frequency television channels.

7. A preset tuning mechanism for ultrahigh frequency television tuners comprising in combination:
an ultrahigh frequency television tuner including an adjustable control shaft for continuously tuning said tuner through the ultrahigh freqency band;
a rotatable cam member having a spiral cam surface;
means providing a plurality of adjustable control elements extending from said cam surface;
detent means associated with said cam member for providing at least one stop position for each of said control elements;
slide means positioned for engagement by successive ones of said adjustable control elements as said cam member is rotated from one stop position to the next;
means coupling said slide means to said tuner control shaft; and
means for adjusting of said adjustable control elements.

8. A preset tuning mechanism for ultrahigh frequency tuners comprising in combination:
- an ultrahigh frequency television tuner including an adjustable control shaft for continuously tuning said tuner through the ultrahigh frequency band;
- a rotatable cam member having a spiral cam surface;
- a plurality of adjustable control elements secured around the periphery of said member and lying generally parallel to the axis of rotation of said member;
- a detented rotary turret associated with said cam member for providing at least one stop position for each of said adjustable control elements;
- a slide positioned for engagement by successive ones of said adjustable control elements as said cam member is rotated from one stop position to the next;
- first gearing means coupling said slide to said tuner control shaft; and
- second gearing means for adjusting of said adjustable control elements.

References Cited

UNITED STATES PATENTS

| | | | |
|---|---|---|---|
| 2,484,331 | 10/1949 | Bels | 74—10.6 X |
| 2,551,959 | 5/1951 | Marshall | 74—10.15 |
| 3,224,282 | 12/1965 | Tyzack | 74—10.8 X |

MILTON KAUFMAN, Primary Examiner

U.S. Cl. X.R.

74—10